United States Patent
Navratil et al.

(10) Patent No.: US 6,777,964 B2
(45) Date of Patent: Aug. 17, 2004

(54) PROBE STATION

(75) Inventors: Peter Navratil, Tualatin, OR (US); Brad Froemke, Portland, OR (US); Craig Stewart, Bloxham (GB); Anthony Lord, Banbury (GB); Jeff Spencer, Vernonia, OR (US); Scott Runbaugh, Tigard, OR (US); Gavin Fisher, Chinnor, OR (US); Pete McCann, Beaverton, OR (US); Rod Jones, Gaston, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/285,135

(22) Filed: Oct. 30, 2002

(65) Prior Publication Data

US 2003/0141861 A1 Jul. 31, 2003

Related U.S. Application Data

(60) Provisional application No. 60/351,844, filed on Jan. 25, 2002.

(51) Int. Cl.⁷ .............................................. G01R 31/02
(52) U.S. Cl. .................................... 324/754; 324/158.1
(58) Field of Search ............................... 324/754, 758, 324/158.1, 765, 757, 762, 761, 752, 750, 501; 165/80.1–80.3; 438/14–18; 257/712, 720, 722; 356/400, 401

(56) References Cited

U.S. PATENT DOCUMENTS

| | | | |
|---|---|---|---|
| 3,176,091 A | | 3/1965 | Hanson et al. |
| 3,714,572 A | | 1/1973 | Ham et al. |
| 3,970,934 A | | 7/1976 | Aksu |
| 4,099,120 A | | 7/1978 | Aksu |
| 4,115,735 A | | 9/1978 | Stanford |
| 4,357,575 A | | 11/1982 | Uren et al. |
| 4,812,754 A | | 3/1989 | Tracy et al. |
| 4,904,935 A | | 2/1990 | Calma et al. |
| 5,101,453 A | | 3/1992 | Rumbaugh |
| 5,214,374 A | | 5/1993 | St. Onge |
| 5,410,259 A | * | 4/1995 | Fujihara et al. ............. 324/758 |
| 5,500,606 A | | 3/1996 | Holmes |
| 5,631,571 A | * | 5/1997 | Spaziani et al. ............. 324/752 |
| 5,828,225 A | * | 10/1998 | Obikane et al. ............. 324/758 |
| 5,879,289 A | | 3/1999 | Yarush et al. |
| 6,037,793 A | * | 3/2000 | Miyazawa et al. .......... 324/760 |
| 6,054,869 A | | 4/2000 | Hutton et al. |
| 6,096,567 A | * | 8/2000 | Kaplan et al. ................ 438/14 |
| 6,137,303 A | * | 10/2000 | Deckert et al. ............. 324/765 |
| 6,144,212 A | | 11/2000 | Mizuta |
| 6,222,970 B1 | | 4/2001 | Wach et al. |
| 6,501,289 B1 | * | 12/2002 | Takekoshi .................... 324/758 |

\* cited by examiner

*Primary Examiner*—Kamand Cuneo
*Assistant Examiner*—Jimmy Nguyen
(74) *Attorney, Agent, or Firm*—Chernoff, Vilhauer, McClung & Stenzel, LL

(57) ABSTRACT

A probe station.

20 Claims, 8 Drawing Sheets

PROBE STATION

BACKGROUND OF THE INVENTION

This application claims the benefit of the U.S. Provisional Patent Application Serial No. 60/351,844 filed Jan. 25, 2002.

The present invention relates to a probe station.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck, that heats or cools the electrical device being tested through thermal conduction.

Many probe stations also incorporate guarding and electromagnetic interference (EMI) shielding structures within or around the environmental enclosures in order to provide an electrically quiet environment, often essential during high frequency testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in *Evaluation Engineering*, November, 1990, pages 150-153.

Probe stations incorporating EMI shielding structures will usually at least partially surround the test signal with a guard signal that closely approximates the test signal, thus inhibiting electromagnetic current leakage from the test signal path to its immediately surrounding environment. Similarly, EMI shielding structures may provide a shield signal to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multi-stage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below.

FIG. 1 shows a generalized schematic of a probe station 10. The probe station 10 includes the chuck 12 that supports the electrical device 14 to be probed by the probe apparatus 16 that extends through an opening in the platen 18. An outer shield box 24 provides sufficient space for the chuck 12 to be moved laterally by a positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. The sliding plate assembly 28 is included to permit lateral movement of the positioner 22, and hence the chuck 12, while maintaining a substantially closed lower perimeter for the shield box 24.

Referring to FIG. 2, in many cases the semiconductor wafers that are tested within such a probe station are edge coupled photonics devices. Edge coupled photonics devices are normally arranged within each semiconductor wafer in orthogonal arrays of devices. Typically, the wafers are sliced in thin strips of a plurality individual optical devices, as illustrated in FIG. 3. Edge coupled photonics devices may include, for example, lasers, semiconductor optical amplifiers, optical modulators (e.g., Machzhender, electro-absorption), edge coupled photo-diodes, and passive devices. Referring to FIG. 4, many such photonics devices provide light output through one side of the device. Normally, the photonics devices receive light through the opposing side of the device from the light output. On another side of the device one or more electrical contacts are provided. In typical operation, the light provided by the device may be modulated or otherwise modified by changing the input light and/or the electrical signal to the device, or the electrical output may be modulated or otherwise modified by changing the input light. Similarly, other photonics devices are surface coupled where the electrical contact and the light output (or light input) are both on the same face of the device, as illustrated in FIG. 5. On such surface coupled photonics device is a VCSEL laser.

Referring to FIG. 6, a typical arrangement to test such photonics devices within a probe station is shown. A set of electrical probe positioners 50 are arranged on the platen to provide electrical signals to and from the device under test, as needed. In addition, one or more optical probe positioners 60 are positioned on the platen to sense the light output from the device under test or provide light to the device under test. As it may be observed, when testing devices that include both optical and electrical attributes the number of positioners may be significant thereby potentially resulting in insufficient space on the platen to effectively accommodate all the necessary positioners. In addition, the opening provided by the platen is normally relatively small so that the space available for extending the probes through the platen is limited. This limited space significantly increases the difficultly in positioning the electrical and optical probes. Similarly, the end of the optical probes typically need to be positioned within 0.10 microns in x/y/z directions which is somewhat awkward from a position on the platen above the chuck. Moreover, the angular orientation of the end portion of the optical probe likewise needs to be very accurate to couple light between the optical probe and the device under test which is similarly difficult. In many applications extreme positional and angular accuracy is needed to couple the optical waveguide or free space optical path (i.e., optical probe) to a photonics device or another optical waveguide. Moreover, during the testing of wafers the optical probes frequently tend to be out of alignment requiring manual alignment for each photonics device while probing each of the devices.

What is desired, then, is a probe station that facilitates accurate alignment of electrical and optical probes.

DETAILED DESCRIPTION OF THE PREFERRED EMBODIMENT

During testing, the end of the optical probes are typically aligned with the edge of the device under test while the electrical probes are typically aligned with the contacts on the upper surface of the device under test, with both the electrical probes and the optical probes being supported by the platen. In many cases, the entire platen is moved in the z-axis direction for selectively contacting the electrical probes on the device under test. Alternatively, the chuck is moved in a z-axis direction. The z-axis movement of the platen permits consistent simultaneous relative movement of all the electrical and optical probes. Each component of the device under test is successively moved in x and/or y lateral directions relative to the electrical probes using a chuck or other support to a location under the electrical probes.

The present inventors considered the z-axis movement of the platen or chuck to perform simultaneous probing and came to the realization that normal z-axis movement of the platen typically brings the probes into contact with the device under test with sufficient additional z-axis movement to result in lateral scrubbing of the contact surfaces to provide a good contact. This additional z-axis movement for the electrical probes, which may vary depending on the particular circuit being probed, different electronic components, the planarity of the devices, and differences in the height of the different contacts between devices, may result in inaccurate alignment of the optical probes which are likewise being moved in the z-axis direction together with the platen or chuck. The alignment of the optical inputs and outputs of the devices tends not to vary in the same manner as the contacts, if they vary significantly at all. In summary, the appropriate z-axis movement of the electrical probes varies depending on the particular device being tested, while the appropriate z-axis movement of the optical probes tends to be at a substantially fixed location with respect to the device under test, which may not be consistent with the z-axis movement provided for the electrical probes. Moreover, the relatively long optical device tends to expand and contract with temperature variations of the environment resulting in additional difficultly properly positioning the optical probe.

Figure 1:
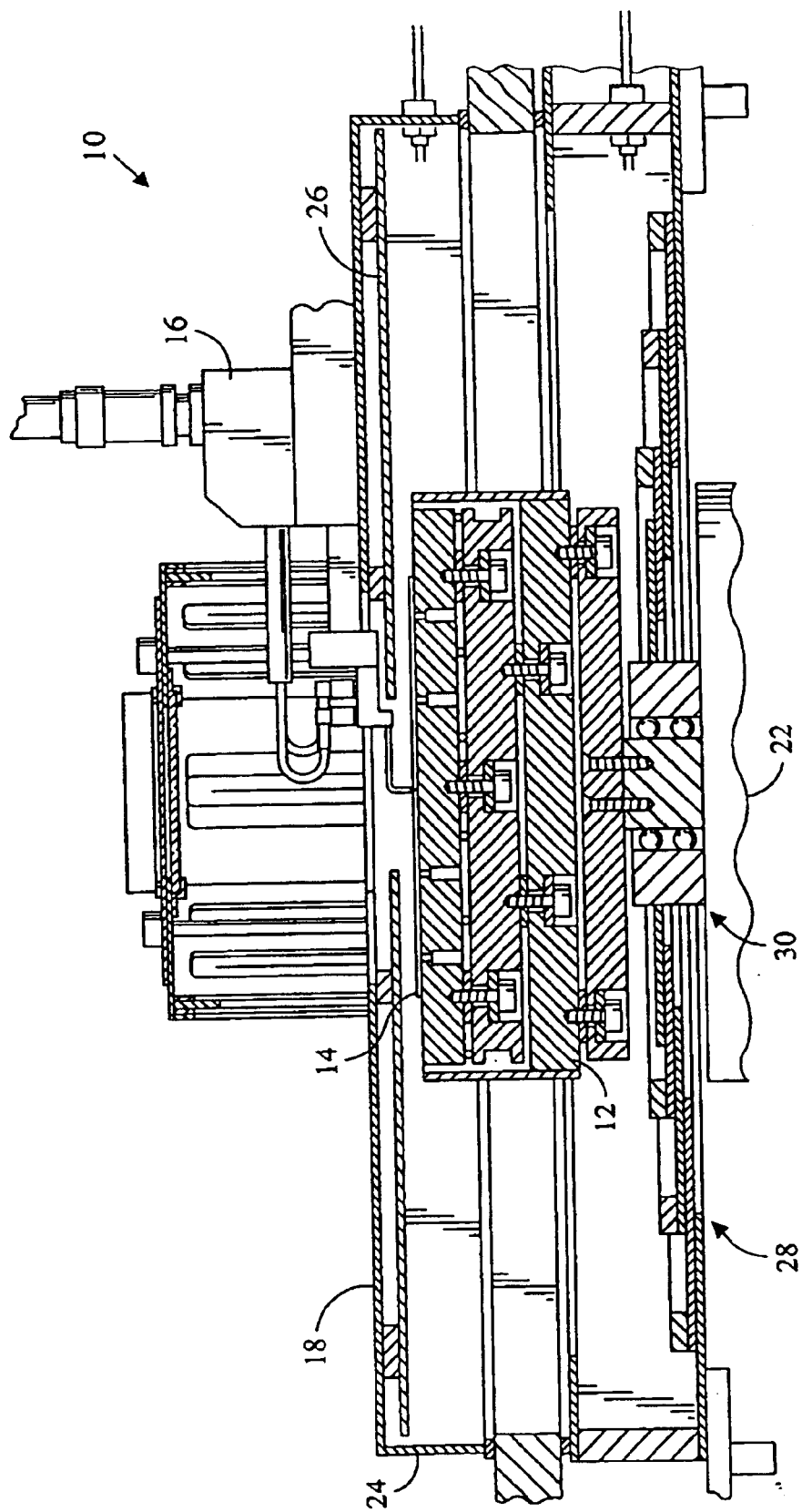
FIG. 1 shows a cross sectional view of an existing probe station.
Figure 2:
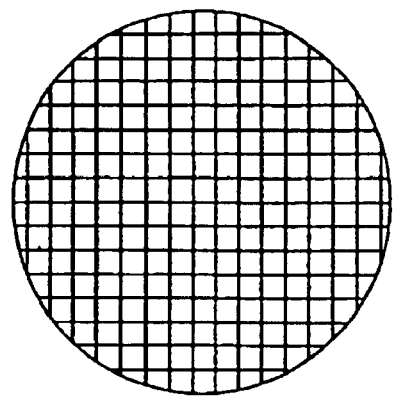
FIG. 2 illustrates a wafer with photonics devices thereon.
Figure 3:
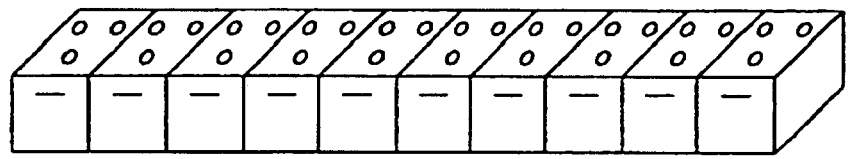
FIG. 3 illustrates a strip of photonics devices.
Figure 4:
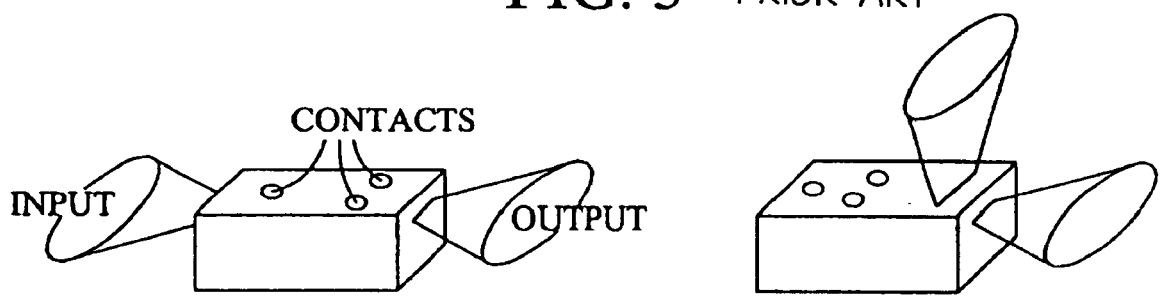
FIG. 4 illustrates an edge coupled photonics device.
Figure 5:
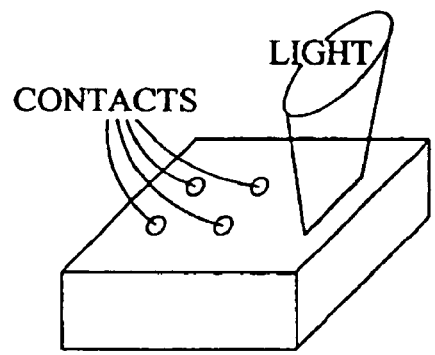
FIG. 5 illustrates an upper surface coupled photonics device.
Figure 6:
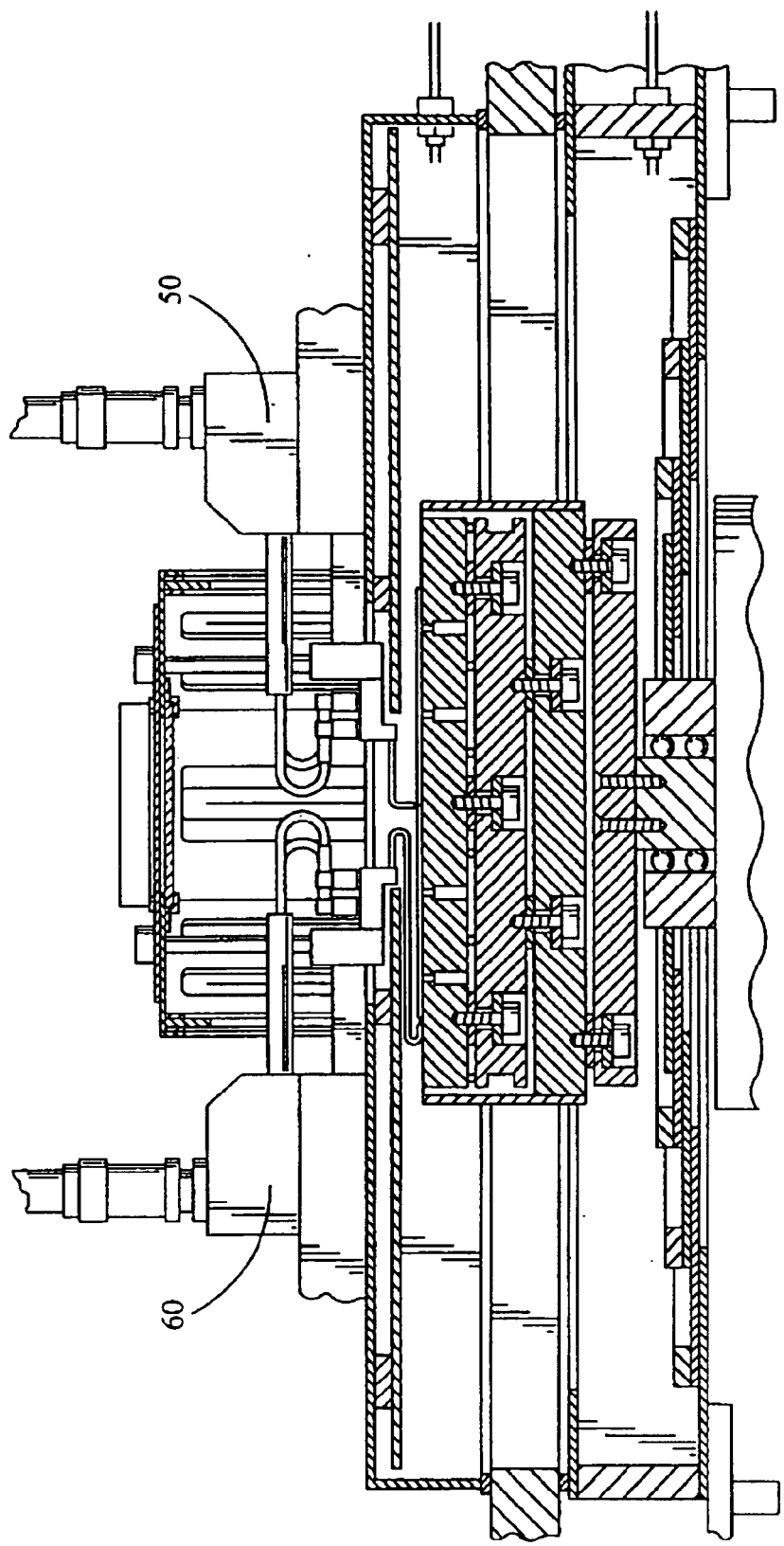
FIG. 6 shows a cross sectional view of the probe station of FIG. 1 with electrical and optical probes.
Figure 7:
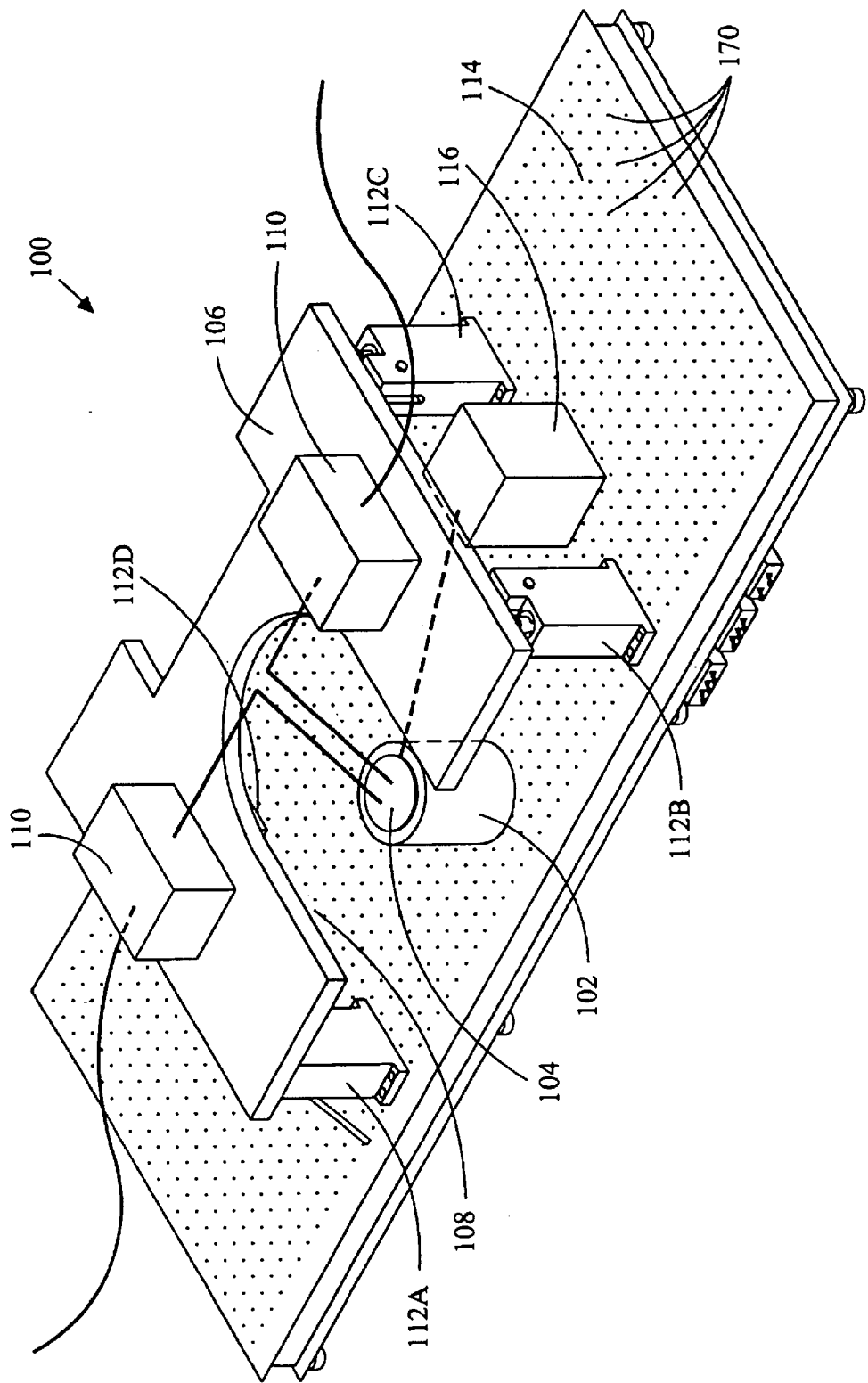
FIG. 7 shows a pictorial view of a modified probe station.

In light of the foregoing realizations the present inventors determined that the traditional probe station should be modified in some manner to facilitate at least partial independent movement or otherwise separation of the optical probes and electrical probes. Referring to FIG. 7, a modified probe station 100 includes a chuck 102 that supports a device under test 104. The device under test 104 in many instances is one or more photonics devices. An upper platen 106 defines an opening 108 therein and is positioned above the chuck 102. The opening 108 may be, for example, completely encircled by the upper platen 106 or a cutout of a portion of the upper platen 106. Electrical probes 110 are supported by the upper platen 106. The platen 106 is supported by a plurality of supports 112a, 112b, 112c, and 112d. Positioned below the supports 112a-112d is a lower platen 114. The optical probes 116 are supported by the lower platen 114. A microscope, not shown, may be used to position the device under test 104 relative to the probes 110 and 116. During probing the upper platen 106 is moved in a z-axis direction to make contact between the electrical probes 110 and the device under test 104. The x and/or y position of the chuck 102 (hence the device under test 104) relative to the electrical probes 110 is modified, and thereafter the upper platen 106 is moved in a z-direction to make contact between the electrical probes 110 and the device under test 104. During testing the optical probes 116 are aligned with the edge of the device under test 104.

In the case that the device under test is moved in a direction perpendicular to the edge of the device under test 104 being tested, it may be observed that the optical probes 116 may not need to be repositioned for each device being tested. If realignment of the optical probes 116 are necessary, there is a good likelihood that minimal adjustment is necessary. In particular, there is a high likelihood that the elevation of the optical probe 116 is accurate (or nearly so) because the chuck 102 is moving within a horizontal plane for testing the device under test 104. It may be observed that optical probes 116 are effectively decoupled from the z-axis motion of the upper platen 106. Moreover movement of the upper platen 106 for bringing the electrical probes 110 into contact with the device under test 104 does not result in movement of the optical probe 116 with respect to the device under test 104. Similarly, it may be observed that movement of the optical probes 116 does not result in movement of the electrical probes 110.

As illustrated in FIG. 7, it may be observed that there is substantial open space on the lower platen 114 to position the optical probes 116. Further, the open space permits operators to access the optical probes 116 to make adjustments, as necessary. For example, the lower platen 114 may include at least 70% of its surface area free of other components and structures, such as the chuck and supports, available for the positioning of optical components thereon. More preferably, at least 80%, 85%, 90%, and 95% of the surface area of the lower platen 114 is free of other components and structures. Moreover, from a region defined by the perimeter of the supports, the lower platen 114 has preferably 70%, 80%, 85%, 90%, or 95% of the surface area of the upper platen free from other components and structures thereon in any outward direction, such as +x, −x, +y, or −y directions. This free space more readily permits the attachment of free space optics thereon, which frequently require substantial space and flexibility to set up. The size of the upper platen 106 may have less surface area, the same surface area, or greater surface area than the lower platen 114. For example, the lower platen 114 (e.g., optical platen) may have a surface area that is 25%, 35%, or 50% or more greater than the upper platen 106 (e.g., non-optical platen). This increased surface area of the lower platen 114 relative to the upper platen 106 permits more open access to the lower platen 114 to locate optical components thereon without limitations resulting from the proximity upper platen 106. Preferably the lower platen 114 is a single integral member or otherwise a rigidly interconnected set of members. It is of course to be understood that the system may include more than two platens, as desired. In addition, the electrical components may be located on the lower platen, as desired. Also, the optical components may be located on the upper platen, as desired, which may include holes therein for an optical breadboard if desired. Furthermore, with the upper platen being maintained in position principally by gravity, such that it would become detached from the supports if the probe station were turned up side down, a set of different upper platens may be provided, each of which is designed to be particularly suitable for a particular test. For example, some upper platens may be small, large, oval, rectangular, thin, thick, etc.

Another feature that may be included is the capability of removing or otherwise moving the upper platen out of the way for in a controlled manner. The movement of the upper platen facilitates the adjustment and installation of the optical components thereunder. For example, a mechanical support mechanism may be included that supports the upper platen while the platen is moved with respect to the remainder of the probe station, and in particular the lower platen. For example, the upper platen may be displaced such that at least 20% (or at least 30% or at least 40% or at least 50%) of its surface area is laterally displaced beyond its original position on the supports. Alternatively, the upper platen may be tilted upwardly. For example, the upper platen may be tilted such that it is at least 5 degrees (or at least 10 degrees or at least 20 degrees or at least 45 degrees or at least 75 degrees) of its surface area is tiled with respect to its position when probing, such as horizontal.

Figure 8:
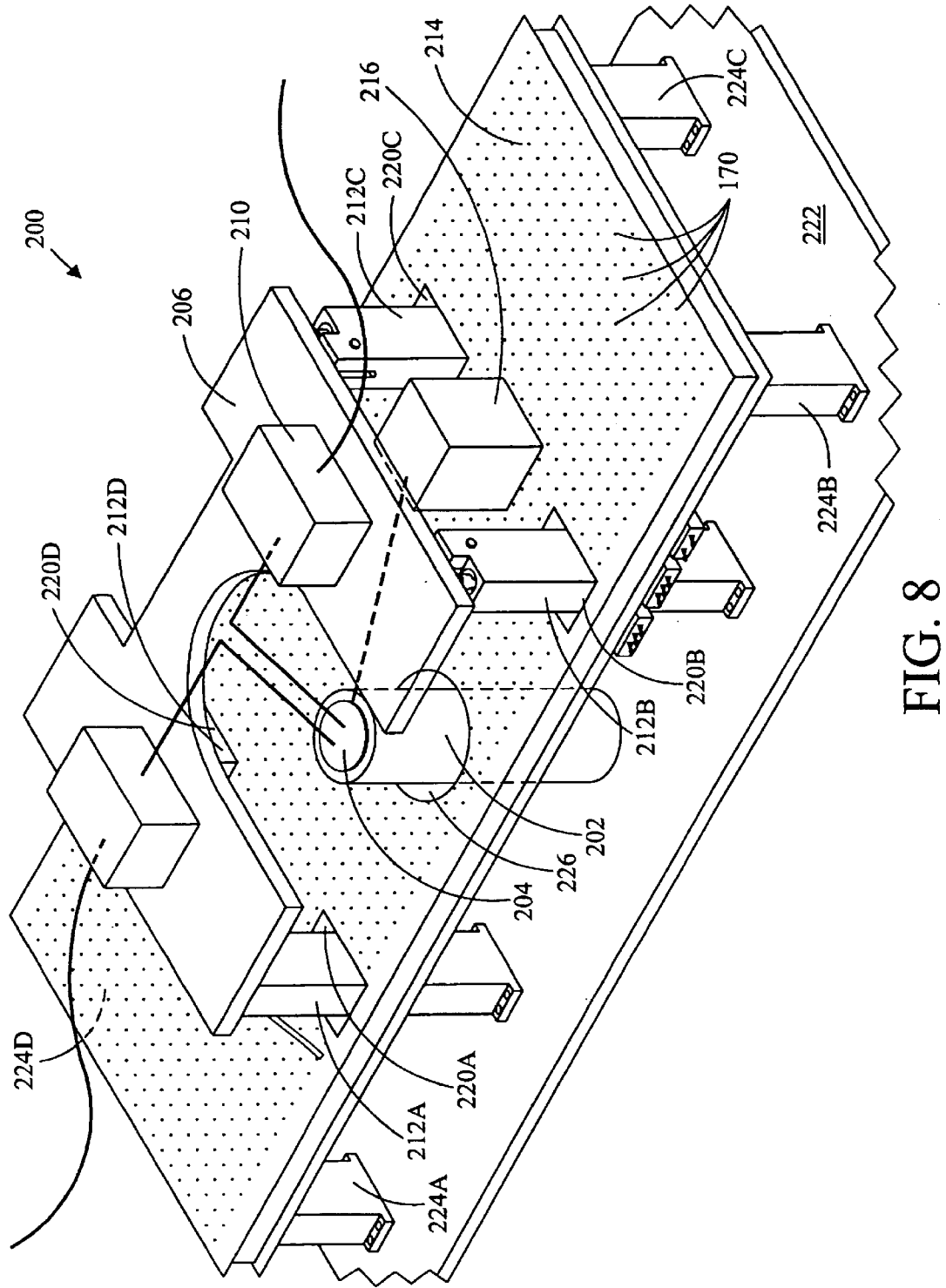
FIG. 8 shows a pictorial view of another modified probe station.

Referring to FIG. 8, a modified probe station 200 includes an upper platen 206 supported by a set of upper supports 212a-212d. The upper supports 212a-212d extend through respective openings 220a-220d in a lower platen 214 and are supported by a base 222. The lower platen 214 is supported by a set of supports 224a-224d which is supported by the base 222. The supports 224a-224d and the supports 212a-212d are preferably adjustable in height. The chuck 202 extends through an opening 226 in the lower platen 214 and is supported by the base 222. With this structure, one or more optical probes 216 supported by the lower platen 214 may be simultaneously moved in the z-axis direction with respect to a device under test 204 supported by the chuck 202. Also, one or more electrical probes 210 may be simultaneously moved in the z-axis direction with respect to a device under test 204 supported by the chuck 202. Furthermore, one or more electrical probes 210 may be simultaneously moved in the z-axis direction with respect to the optical probes 216, or vise versa, both of which may be moved relative to the device under test 204. This permits effective realignment of one or more optical probes 216 with respect to the edge of the device under test 204. In this manner, at least a portion of the alignment of the optical probes 216 may be performed by the probe station, as opposed to the individual positioners attached to the optical probes 116. It is to be understood that the lower platen 214 is preferably positioned at a location below the device under test 204 while the upper platen 206 is positioned above the device under test 204. Also, it is to be understood that the lower platen 214 may be positioned at a location above the device under test 204 while the upper platen 206 is likewise positioned above the device under test 204. Also, it is to be understood that the lower platen 214 may be positioned at a location below the device under test 204 while the upper platen 206 is likewise positioned below the device under test 204. Moreover, the range of movement of the supports may permit the upper platen 206 and/or the lower platen 214 to be moved from a position above the device under test 214 to a position below the device under test 214, or from a position below the device under test 214 to a position above the device under test 214.

Figure 9:
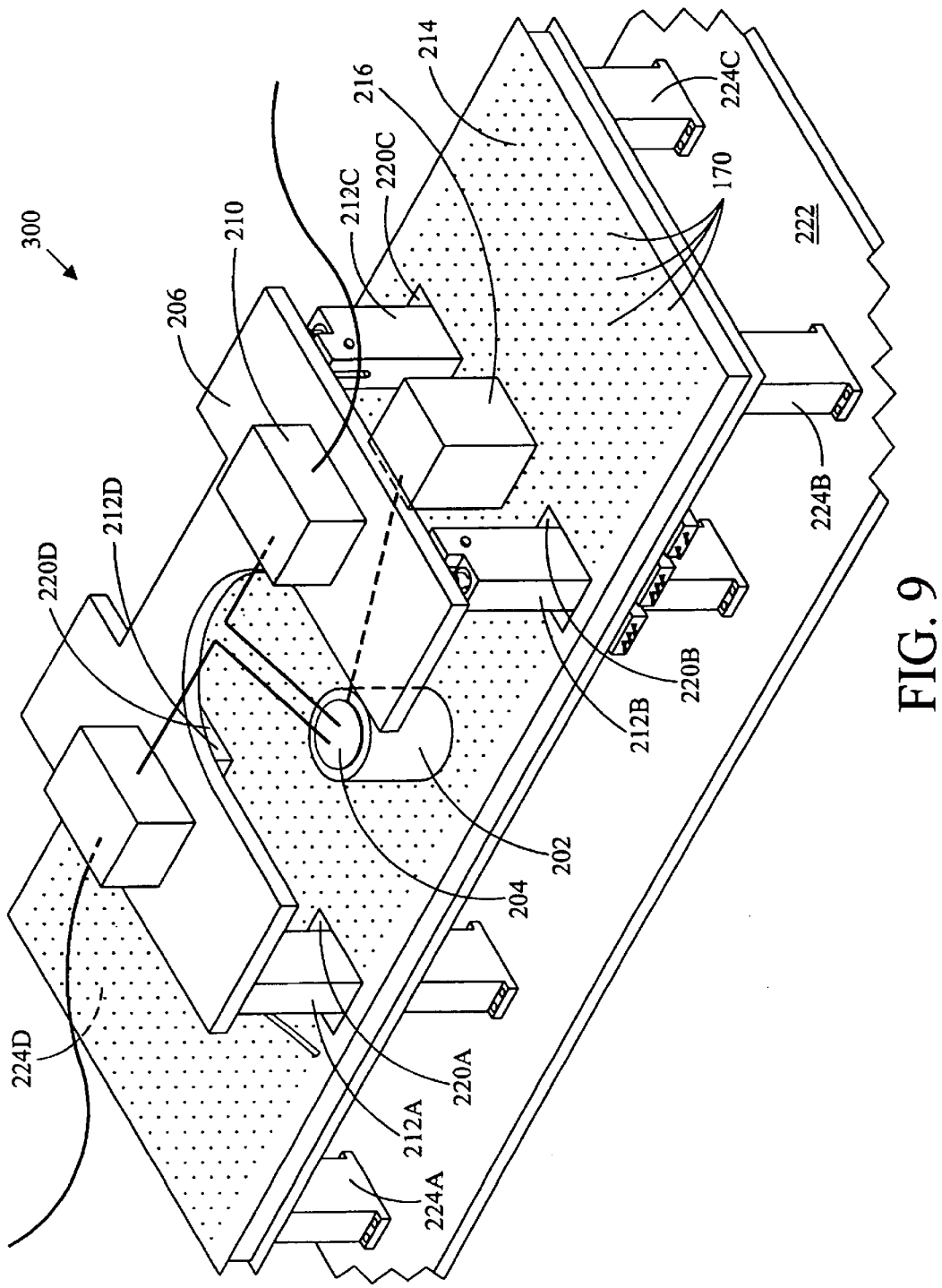
FIG. 9 shows a pictorial view of yet another modified probe station.

Referring to FIG. 9, a modified probe station 300 includes the chuck 202 being supported by the lower platen 214. In this manner, the chuck 202 and the lower platen 214 will move together in the z-axis. This is beneficial, at least in part, to assist in maintaining the relative alignment between the optical probes and the device under test.

Referring to FIGS. 7-9, the lower platen (or the upper platen) may include a set of openings 170 defined therein suitable for engaging an optical device. Typically the openings 170 are arranged in an orthogonal array. The openings 170 provide a convenient mechanism for interconnection between the lower platen and the optical probes.

The probe station facilitates the testing of a photonics device that includes an optical test path, which is optimized based upon optical characteristics. In addition, the probe station facilitates the testing of a photonics device that includes an electrical test path, which is similarly optimized based upon electrical characteristics. Typically multiple electrical probes are supported and simultaneously brought into contact with the device under test. In this manner, the probe station includes a structure that brings together optimized electrical test paths and optimized optical test paths together on the device under test.

Figure 10:
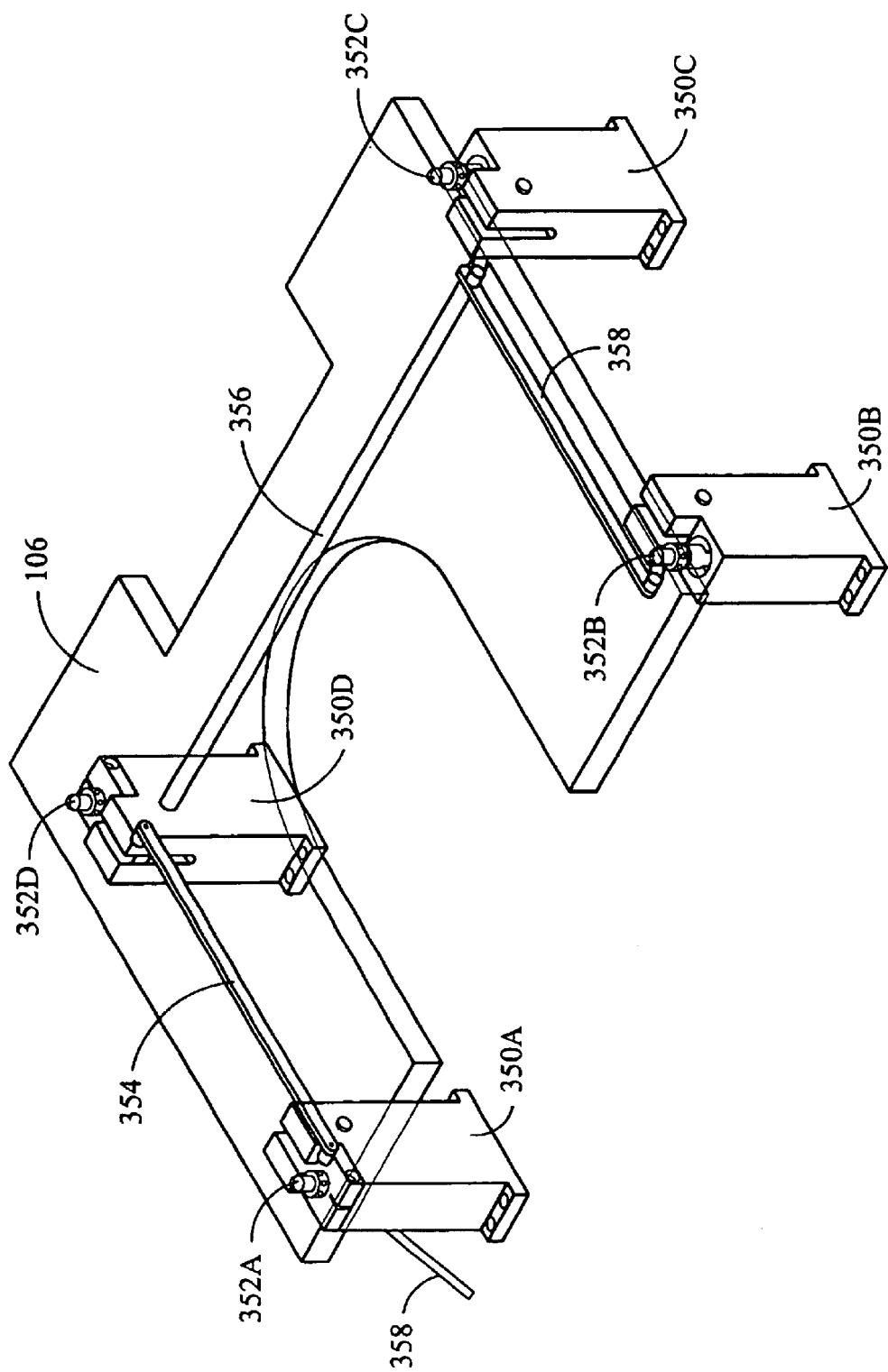
FIG. 10 shows a pictorial view of the support assembly for the probe station of FIG. 7.

Referring to FIG. 10, the upper platen 106 (or other platens) is supported by a plurality of supports 350a-350d. Preferably the platen 106 is supported by a set of contacts 352a-352d. The contacts 352a-352d are preferably not fixedly interconnected with the upper platen 106, but rather maintained in contact by the force of gravity free from a fixed interconnection, such as a screw or bolt. Accordingly, the upper platen 106 may be removed from the supports 350a-350d by merely lifting the upper platen 106. A set of interconnecting members 354, 356, and 358 may be included to provide increased rigidity to the supports 350a-350d. In addition, the length of the interconnecting members 354, 356, 358 may be adjustable, such as extending through the supports 350a-350d or otherwise including a length adjustment mechanism for the interconnecting members themselves. In this manner the upper platen 106 may be lifted from the supports 350a-350d, the position of the supports 350a-350d and relative spacing thereof modified, and the upper platen 106 repositioned on the supports 350a-350d. In addition, a mechanical lift mechanism 358 may be included to raise and lower the upper platen 106. Also, the supports 350a-350d may include internal height adjustment for z-axis movement. Further, computer controlled lift control mechanisms may likewise be used. Moreover, it may be observed that the upper platen 106 may be moved in the z-axis direction, and in the x and/or y direction by simply moving the upper platen 106. In an alternative embodiment, the supports 350a-350d may include horizontal movement structures to move the upper platen 106 in the x and/or y directions. As one example, the horizontal movement structures may be a set of rollers that permit the selective lateral movement of the upper platen 106.

Figure 11:
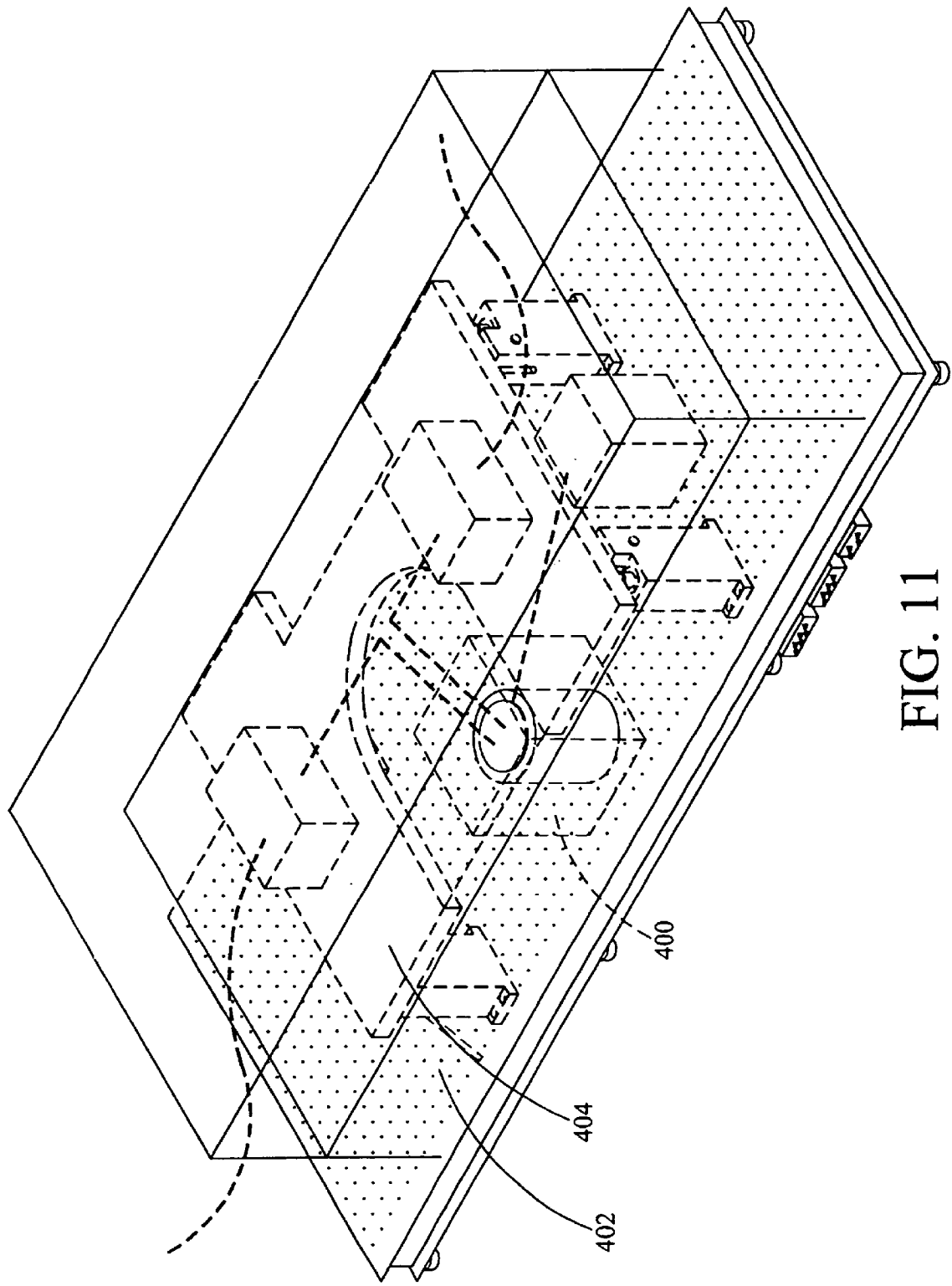
FIG. 11 shows a pictorial view of a further modified probe station.

Referring to FIG. 11, a substantially enclosed environment 400 may be provided around the device under test. The environment may be electrically connected to an earth ground potential, an instrument ground potential, a guard potential, a shield potential, or otherwise remains floating. An optical box 402 may be provided within the lower region of the probe station to provide a substantially light tight environment around the device under test, which may be useful for many applications. The optical box 402 preferably includes a plurality of sealable openings to permit access to the optical probes. An electrical box 404 may be provided within the upper region of the probe station to provide a substantially noise controlled environment around the electrical probes, which may be useful for many applications. The electrical box 404 may be electrically connected to an earth ground potential, an instrument ground potential, a guard potential, a shield potential, or otherwise remains floating.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station for testing a device under test comprising:
   (a) a first platen supporting an electrical probe;
   (b) a chuck supporting said device under test;
   (c) a second platen supporting an optical probe;
   (d) said first platen positioned above said device under test and said second platen positioned below said device under test;
   (e) at least 70% of the top surface of said second platen terminating in free space when said optical probe is not supported thereon; and
   (f) said first platen is maintained in position with respect to said second platen by gravity such that if said probe station were turned upside down said first platen would freely fall away from said second platen.

2. A probe station for testing a device under test comprising:
   (a) an upper platen supporting an electrical probe;
   (b) a chuck supporting said device under test;
   (c) said upper platen is positioned above said device under test; and
   (d) a movement mechanism laterally displacing said upper platen in a controlled manner such that at least 20% of the surface area of said upper platen is laterally displaced to a spatial region not previously occupied by said upper platen prior to said lateral displacement.

3. The probe station of claim 2 wherein said controlled manner is at least 30% of said surface area.

4. The probe station of claim 2 wherein said controlled manner is at least 40% of said surface area.

5. The probe station of claim 2 wherein said controlled manner is at least 50% of said surface area.

6. A probe station for testing a device under test comprising:
   (a) an upper platen supporting an electrical probe;
   (b) a chuck supporting said device under test;
   (c) said upper platen is positioned above said device under test; and
   (d) a movement mechanism angularly displacing said upper platen in a controlled manner such that said upper platen is tilted at an angle of at least 5 degrees with respect to the angle of said upper platen when probing said device under test.

7. The probe station of claim 2 wherein said controlled manner is at least 10 degrees.

8. The probe station of claim 2 wherein said controlled manner is at least 20 degrees.

9. The probe station of claim 2 wherein said controlled manner is at least 45 degrees.

10. The probe station of claim 2 wherein said controlled manner is at least 75 degrees.

11. A method of probing a device under test comprising:
    (a) supporting said device under test on a first support;
    (b) supporting an electrical probe on a second support;
    (c) supporting an optical probe on a third support, wherein the upper surface of said first support is located between said second support and said third support; and
    (d) selectively moving,
        (i) said first support with respect to said second support;
        (ii) said second support with respect to said third support; and
        (iii) said first support with respect to said thrid support; and
    (e) wherein said second support is supported by said third support.

12. A method for probing a device under test comprising:
    (a) supporting said device under test on a first support;
    (b) supporting an electrical probe on a second support;
    (c) supporting an optical probe on a third support; and
    (d) moving said electrical probe relative to said device under test in a first direction generally perpendicular to the surface of said device under test to sense electrical characteristics of said device under test while said optical probe remains substantially aligned with the edge of said device under test to sense optical characteristics of said device under test.

13. The method of claim 12 wherein said first support is a chuck.

14. The method of claim 13 wherein said chuck includes a substantially planar upper surface.

15. The method of claim 12 wherein said second support is a platen positioned above said device under test.

16. The method of claim 15 wherein said platen defines an opening therein though which a portion of said electrical probe extends.

17. The method of claim 12 wherein said first support is located between said second support and said third support.

18. The method of claim 12 wherein said second support and said third support remain stationary with respect to each other while said first support moves relative to said device under test while said moving.

19. The method of claim 12 wherein said first direction is a z-axis direction.

20. The method of claim 12 wherein said electrical probe may be moved independently of said optical probe.

* * * * *

UNITED STATES PATENT AND TRADEMARK OFFICE
CERTIFICATE OF CORRECTION

PATENT NO. : 6,777,964 B2
DATED : August 17, 2004
INVENTOR(S) : Navratil et al.

It is certified that error appears in the above-identified patent and that said Letters Patent is hereby corrected as shown below:

<u>Column 8,</u>
Line 33, change "to said thrid support;" to -- to said third support; --

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,777,964 B2
DATED : August 17, 2004
INVENTOR(S) : Navratil et al.

It is certified that error appears in the above-identified patent and that said Letters Patent is hereby corrected as shown below:

Column 2,
Line 28, change "plurality individual" to -- plurality of individual --.

Column 4,
Line 9, change "additional difficultly" to -- additional difficulty --.

Column 5,
Line 47, change "is tiled with" to -- is titled with --.

Column 8,
Line 55, change "therein though which" to -- therein through which --.

Signed and Sealed this

Twenty-seventh Day of September, 2005

JON W. DUDAS
*Director of the United States Patent and Trademark Office*